United States Patent [19]

Francis

[11] Patent Number: 5,754,564
[45] Date of Patent: May 19, 1998

[54] METHOD OF CONTINUOUS CALCULATION OF CYCLIC REDUNDANCY CHECK

[75] Inventor: James Covosso Francis, Rochester, N.Y.

[73] Assignee: Harris Corporation, Melbourne, Fla.

[21] Appl. No.: 811,235

[22] Filed: Mar. 3, 1997

Related U.S. Application Data

[63] Continuation of Ser. No. 295,255, Aug. 24, 1994, abandoned.

[51] Int. Cl.⁶ .................. H03M 13/00; G06F 11/10
[52] U.S. Cl. .............. 371/37.1; 371/37.6; 371/37.7; 371/53
[58] Field of Search ............... 371/37.1, 37.4, 371/37.6, 37.7, 3, 53, 20.2

[56] References Cited

U.S. PATENT DOCUMENTS

| | | |
|---|---|---|
| 4,498,178 | 2/1985 | Ohhashi .................. 371/37.6 |
| 4,809,273 | 2/1989 | Jackowski et al. .......... 371/3 |
| 4,890,286 | 12/1989 | Hirose .................. 371/37.1 |
| 5,103,451 | 4/1992 | Fossey .................. 371/37.6 |
| 5,121,396 | 6/1992 | Irvin et al. .............. 371/53 |

*Primary Examiner*—Reba I. Elmore
*Assistant Examiner*—Emmanuel L. Moise
*Attorney, Agent, or Firm*—Rogers & Killeen

[57] ABSTRACT

Every word or bit received in a stream of bits may be checked to determine whether the end of a packet of bits has been located. The receiving system calculates a remainder polynomial $r^k(x)$—a cyclic redundancy check, or CRC—for each word or bit and then evaluates whether $r^k(x)$ is equal to zero. If $r^k(x)$ is equal to zero, the end of a packet has been found. The remainder polynomial $r^k(x)$ is the remainder of a division of (i) a polynomial $a^k(x)$ defining the stream of bits ending in the bit or word for which $r^k(x)$ is calculated, by (ii) a defined generating polynomial $g(x)$. The remainder polynomial $r^k(x)$ may be calculated without performing the polynomial division for each calculation by adding partial remainders that are functions of the $r^k(x)$ for the previous bit or word, or are available in a table. A shortened code may be used for the encoded data.

16 Claims, 2 Drawing Sheets

FOR:
$g(x) = 1 + x^3 + x^4 + x^5 + x^6 + x^8 + x^9 + x^{11} + x^{13} + x^{16} + x^{21} + x^{22} + x^{24} + x^{26} + x^{27}$

TABLE VALUES:

$b_{0+k} \cdots b_{7+k}$ $(b_{0+k} x^7 + \ldots + b_{7+k}) x^{504}$ MODULE $g(x)$ $\overset{m\ (63\ bytes)}{\longrightarrow}$

| | |
|---|---|
| 0000 0000 | 0 |
| 1000 0000 | $x^4 + x^6 + x^8 + x^9 + x^{10} + x^{11} + x^{12} + x^{13} + x^{16} + x^{19} + x^{20} + x^{21} + x^{25}$ |
| 0100 0000 | $x^5 + x^7 + x^9 + x^{10} + x^{11} + x^{12} + x^{13} + x^{14} + x^{16} + x^{20} + x^{21} + x^{22} + x^{26}$ |
| 1100 0000 | $x^4 + x^5 + x^6 + x^7 + x^8 + x^{14} + x^{15} + x^{16} + x^{19} + x^{22} + x^{24} + x^{26}$ |

FIG. 3

METHOD OF CONTINUOUS CALCULATION OF CYCLIC REDUNDANCY CHECK

This is a continuation of application Ser. No. 08/295,255, filed Aug. 24, 1994, abandoned.

BACKGROUND OF THE INVENTION

The present invention relates to methods of checking the integrity of data packets that are routed in data streams through a communications medium in a communications system, and more particularly to an efficient method of determining when a data packet ends by noting when a packet-sized group of data passes an integrity check, that is, by performing continuous cyclic redundancy checks.

Communications systems may use data bits grouped in packets to communicate information. As illustrated in FIG. 1, a typical packet may include a string of bits that define a start sequence, a header with address information, data, an integrity check value, and an end sequence.

Typically, the integrity of a data in a packet is checked at the receiving system by comparing an integrity check value calculated at the receiving system to the integrity check value calculated and provided in the packet by the transmitting system. If the two calculated integrity check values for a packet are not the same, the data in the packet is presumed to have changed since transmission and the receiving system may ask the transmitting system to retransmit the packet.

The integrity check value may use various algorithms, with cyclic redundancy check (CRC) algorithms being common. CRC algorithms treat bit strings as coefficients of polynomials (i.e., the coefficients are either 0 or 1.) A packet of m bits, $b_0, b_1, b_2, \ldots b_{m-1}$, defines a polynomial:

$$a^0(x) = b_{m-1} + b_{m-2}x + \ldots + b_1 x^{m-2} + b_0 x^{m-1} \quad (1)$$

In the CRC algorithm this polynomial is divided by another polynomial, typically a standard generating polynomial g(x) that is defined for the length (in bits) of the integrity check value in the packet. The remainder $r^k(x)$ of this polynomial division may be the CRC value or the CRC value may be derived from it. The remainder $r^k(x)$ is a remainder calculated for bits $b_k, \ldots b_{m-1+k}$.

When the receiving system reaches the end of a packet, the receiving system performs the polynomial division and compares the result to the value in the packet that was calculated by the transmitting system using the same algorithm. If the two values match, the packet is presumed, with a high probability, to be unchanged from transmission. Standard CRC algorithms are known and discussed, for example, in U.S. Pat. No. 5,121,396 issued Jun. 9, 1992 to Irvin, et al. and in U.S. Pat. No. 5,282,214 issued Jan. 25, 1994 to Dravida.

However, before the CRC algorithm can be calculated, the receiving system must know where—that is, on which bit—the packet ends. Heretofore packet boundaries have been indicated by placing a recognizable bit pattern between packets, such as a series of synchronization bits. The receiving system knows that the packet has ended when it recognizes the predetermined pattern. As will be appreciated, the bits added for the pattern between packets consume a portion of system capacity. Further, the number of bits in the pattern must be large enough to be recognized and thus the delay can be significant. If the delay is long enough, packets may have to be buffered.

Accordingly, it is an object of the present invention to provide a novel method of checking the integrity of data packets that obviates the problems of the prior art.

It is another object of the present invention to provide a novel method of determining when a data packet ends by checking each bit to determine whether a packet-sized group of data bits passes an integrity check.

It is yet another object of the present invention to provide a novel method of calculating a remainder polynomial for each word or bit in a stream of data bits wherein the end of a packet is located when the calculated remainder polynomial equals zero.

It is still another object of the present invention to provide a novel method of calculating a remainder polynomial for each word or bit in a stream of data bits without performing a polynomial division in each calculation.

It is a further object of the present invention to provide a novel method of calculating a remainder polynomial for each word or bit in a stream of data bits by adding remainders of a division of $a^k(x)$ by g(x).

It is still a further object of the present invention to provide a novel method of determining when a data packet ends by calculating a remainder polynomial for each word or bit in a stream of data bits by adding remainders of a division of $a^k(x)$ by g(x), without actually performing the division, so as to be able to determine when a packet has ended.

These and many other objects and advantages of the present invention will be readily apparent to one skilled in the art to which the invention pertains from a perusal of the claims, the appended drawings, and the following detailed description of preferred embodiments.

BRIEF DESCRIPTION OF THE DRAWINGS

FIG. 3 is a portion of table illustrating values that may be used in the calculation of the remainder polynomial.

DESCRIPTION OF PREFERRED EMBODIMENTS

Figure 1:
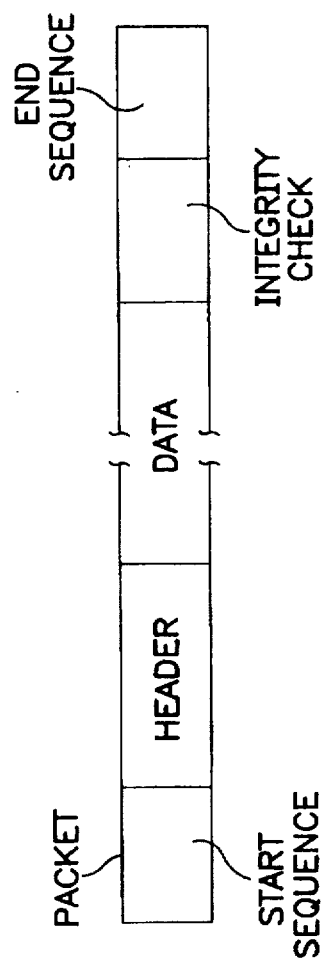
FIG. 1 illustrates a packet format of the prior art.
Figure 2:
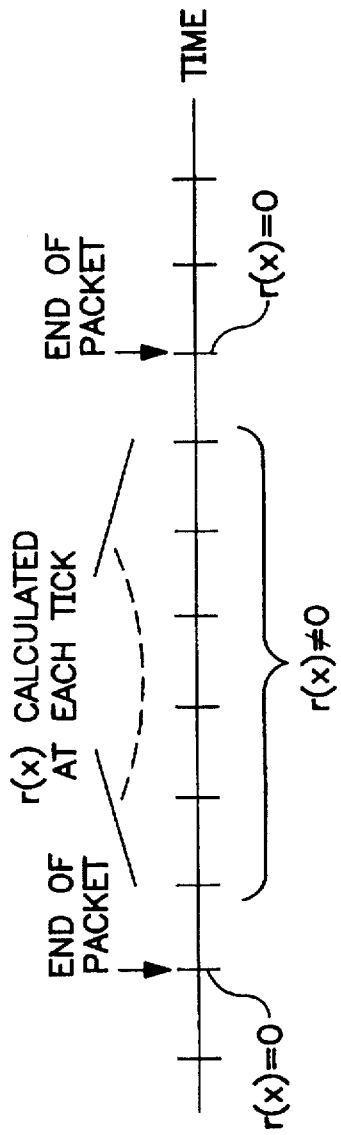
FIG. 2 illustrates a data arrival sequence, indicating when a remainder polynomial is calculated and the anticipated results.

In a preferred embodiment of the present invention, every word (e.g., a byte), or even every bit, received in a stream of bits is checked to determine whether the end of a packet of bits has been located. The receiving system calculates a remainder polynomial $r^k(x)$—a cyclic redundancy check, or CRC—for each word or bit and then evaluates whether $r^k(x)$ is equal to zero. If $r^k(x)$ is equal to zero, the end of a packet has been found. As illustrated in FIG. 2, the remainder polynomial $r^k(x)$ for each word or bit not at the end of a packet is not equal to zero (with a high probability.)

The remainder $r^k(x)$ is the remainder of (i) a polynomial $a^k(x)$ defining the stream of bits ending in the bit for which $r^k(x)$ is calculated, that has been divided by (ii) a defined generating polynomial g(x).

As set forth below, first for a bit-by-bit calculation of the remainder polynomial $r^k(x)$ and thereafter for a byte-by-byte calculation, $r^k(x)$ may be calculated without performing the polynomial division for each calculation. Typically, the polynomial division of the prior art is performed once a packet for a CRC calculation and is complex and time consuming. The total of the calculations herein that are performed far more frequently is of comparable complexity and consumes about the same time.

Derivation of $r^k(x)$ for each bit.

A packet of m bits, $b_0, b_1, b_2, \ldots b_k, \ldots, b_m$, defines a polynomial:

$$a^0(x) = b_{m-1} + b_{m-2}x + \ldots + b_1 x^{m-2} + b_0 x^{m-1} \quad (2)$$

The packet of m bits beginning with $b_1$ defines a polynomial:

$$a^1(x) = b_m + b_{m-1}x + \ldots + b_2 x^{m-2} + b_1 x^{m-1} \quad (3)$$

that may be written recursively as:

$$a^1(x) = x a^0(x) + b_m + b_0 x^m \quad (4)$$

where the arithmetic is performed over a Galois Field in which each symbol corresponds to a bit (i.e., GF(2)).

Thus, in general:

$$a^{k+1}(x) = x a^k(x) + b_{m+k} + b_k x^m \quad (5)$$

The generating polynomial g(x) is preferably a standard CRC generating polynomial that has been internationally defined for each number of bits in the integrity value portion of the packet. By way of example, for a 16 bit integrity check value:

$$g(x) = 1 + x^2 + x^{15} + x^{16} \quad (6)$$

The packet of m bits beginning with $b_k$ and ending with $b_{k+m}$ is a packet (with high probability) if g(x) divides into $a^k(x)$ without a remainder. By way of explanation, consider that $$a^k(x) = q^k(x) g(x) + r^k(x) \quad (7)$$

where $q^k(x)$ is the quotient polynomial, and $r^k(x)$ is the remainder polynomial (deg $r^k(x)$ < deg g(x)). When $r^k(x)$ is equal to zero, g(x) divides into $a^k(x)$ evenly and the end of the packet has been located. At this point, it is known that $r^k(x)$ is equal to zero at the end of a packet, but the determination of $r^{k+1}(x)$ is more troublesome because a polynomial division would have to be performed. It is an object of the invention to obviate the need for polynomial division so that $r^k(x)$ can be determined for each bit (or word). Significantly, $r^{k+1}(x)$ can be determined without polynomial division. Consider that when equations (5) and (7) above are combined:

$$a^{k+1}(x) = x q^k(x) g(x) + x r^k(x) + b_{m+k} + b_k x^m \quad (8)$$

The remainder polynomial $r^{k+1}(x)$ may be computed as the sum of remainders when each of the four terms in equation (8) is divided by g(x). These four remainders are:

$$\{x q^k(x) g(x)\} \bmod g(x) = 0 \quad (9)$$

$$\{x r^k(x)\} \bmod g(x) = x r^k(x) + \{x r^k(x)\}_{\deg g(x)} g(x) \quad (10)$$

where $\{(x r^k(x)\}_{\deg g(x)}$ is the coefficient of $x^{\deg g(x)}$ in the polynomial $x r^k(x)$.

$$\{b_{m+k}\} \bmod g(x) = b_{m+k} \quad (11)$$

$$\{b_k x^m\} \bmod g(x) = b_k \{x^m\} \bmod g(x) \quad (12)$$

where $\{x^m\}$ modulo g(x) does not depend on the data and may be precalculated (it will have but a single value) and stored.

Thus, $$r^{k+1}(x) = x r^k(x) + \{x r^k(x)\}_{\deg g(x)} g(x) + b_{m+k} + b_k \{x^m\} \bmod g(x) \quad (13)$$

As is apparent, the remainder polynomial for the k+1 bit is a function of the remainder polynomial for the previous bit. Where the previous bit ended a packet, the remainder polynomial for the previous bit is zero and the calculation of equation (13) devolves to the addition of the last two terms, neither of which requires a polynomial division. Thereafter, the remainder polynomials may calculated by adding the four terms, again without a polynomial division. Note further that for $r_{-m}(x) = 0$, and $b_k = 0$ if k<0, m applications of equation (13) yields $r^0(x)$ in a computational effort comparable to a single polynomial division.

Derivation of $r^k(x)$ for each word.

In some applications, data are handled by a protocol controller that may be word, rather than bit, oriented. By way of example, with 8-bit words (a byte), the remainder polynomials of interest are $r^{8j}(x)$, j=0, 1, 2, . . . By following the steps described above for bits, the equation for bytes that is comparable to equation (13) is:

$$r^{k+8}(x) = \{x^8 r^k(x)\} \bmod g(x) + \quad (14)$$
$$(b_{m+k} x^7 + b_{m+1+k} x^6 + \ldots + b_{m+7+k}) +$$
$$\{(b_k x^7 + b_{1+k} x^6 + \ldots + b_{7+k}) x^m\} \bmod g(x)$$

assuming that deg g(x)>8, as it clearly is, and where b still refers to a bit value. The last bit of a packet is the (k+8+m−1)th bit.

Note that the first term in equation (14) can be computed and stored in a table. By way of example, let $$x^8 r^k(x) = u(x) x^{\deg g(x)} + v(x) \quad (15)$$

where deg u(x)<8 and deg v(x)<deg g(x). Then, $$\{x^8 r^k(x)\} \bmod g(x) = \{u(x) x^{\deg g(x)}\} \bmod g(x) + v(x) \quad (16)$$

The first term on the right-hand side of equation (16) can only be one of 256 polynomials of degree <deg g(x) that may be stored in a table, and v(x) may be easily calculated.

Similarly, the last term in equation (14) can only be one of 256 polynomials of degree <deg g(x) that may be stored in a table. By way of example, a portion of such a table is illustrated in FIG. 3.

In an alternative embodiment, $r^k(x)$ may have a predetermined value other than zero, such as one, to indicate packet end.

Shortened Codes.

In the method of the present invention the cyclic property of cyclic redundancy checks (CRC) may confuse the calculations and cause an incorrect end-of-packet indication, and to avoid this potential problem it is desirable that shortened codes be used for the encoded data.

The polynomials that are used in CRCs are multiples of a generator g(x). That is, $$c(x) = i(x) g(x) \quad (17)$$

Cyclic codes are codes that have the property that if c(x) is an element of the code, then a cyclic shift of c(x), denoted c*(x), is also an element of the code. That is, $$c(x) = c_{m-1} x^{m-1} + \ldots + c_1 x + c_0 \quad (18)$$

$$c^*(x) = c_{m-2}x^{m-1} + \ldots + c_0x + c_{m-1} \quad (19)$$

This means that $$c^*(x) = i^*(x)g(x) \quad (20)$$

and so the CRC checks for $c^*(x)$.

This cyclic property may cause an erroneous reading in the method herein. Consider the sequence of data, $C_0, C_1, \ldots C_{m-1}$, ? (where $c_0$ through $c_{m-1}$ is a packet.) If the ? is $c_0$ (and this could occur as frequently as one-half of the time), then the CRC would check (the remainder would be zero) and give a false end-of-packet indication.

Shortened codes alleviate this potential problem. Encoded information may actually appear as coefficients of $c(x)$. When a code is shortened, some of the coefficients of the code polynomial are understood to be zero and are not transmitted. The set of polynomials (deg $c(x)=m-1$) containing a fixed coefficient of zero cannot be cyclic; that is, shifting any nonzero $c(x)$ would eventually shift a nonzero coefficient to a spot which is understood to be zero. Shortened codes are not cyclic and therefore eliminate the potential incorrect indications. Most packet protocols use shortened codes, or may do so with little penalty.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of evaluating the integrity of a packet of m data bits being routed in a stream of bits through a communications medium in a data communications system, the method comprising the steps of:

(a) providing a stream of bits in packets of m data bits through a communication medium in a data communication system;

(b) calculating a remainder polynomial $r^k(x)$ for each word in the stream of bits; and (c) evaluating whether $r^k(x)$ is equal to zero, the end of one of the packets being located and the integrity of the one of the packets being affirmed when $r^k(x)=0$;

(d) retransmitting said one of the packets based on the result of said evaluating step.

2. The method of claim 1 wherein the remainder polynomial $r^k(x)$ for each word in the stream of bits is calculated without performing a polynomial division for each word.

3. The method of claim 1 wherein $r^k(x)$ for each word is obtained by adding partial remainders derived from at least one of $r^k(x)$ for the previous word and a table of partial remainders.

4. The method of claim 1 wherein the word contains 8 bits and the remainder polynomial is calculated from:

$$r^{k+8}(x) = \{x^8 r^k(x)\} \text{modulo } g(x) + (b_{m+k}x^7 + b_{m+1+k}x^6 + \ldots + b_{m+7+k}) + \{(b_k x^7 + b_{1+k}x^6 + \ldots + b_{7+k})x^m\} \text{modulo } g(x)$$

where $g(x)$ is a cyclic redundancy check (CRC) generating polynomial, and b is a bit value.

5. The method of claim 4 wherein the term $\{x^8 r^k(x)\}$ modulo $g(x)$ is drawn from a table containing possible values of the term.

6. The method of claim 4 wherein the term $\{(b_k x^7 + b_{1+k}x^6 + \ldots + b_{7+k})x^m\}$ modulo $g(x)$ is drawn from a table containing possible values of the term.

7. The method of claim 1 further comprising the step of calculating a remainder polynomial for each bit in the stream of bits.

8. The method of claim 7 wherein $r^k(x)$ for each bit is obtained by adding partial remainders derived from at least one of $r^k(x)$ for the previous bit and a table of partial remainders.

9. The method of claim 7 wherein the remainder polynomial is calculated from:

$$r^{k+1}(x) = xr^k(x) + \{xr^k(x)\}_{\deg g(x)} g(x) + b_{m+k} + b_k \{x^m\} \text{modulo } g(x)$$

where $g(x)$ is a cyclic redundancy check (CRC) generating polynomial, b is a bit value, and where $\{xr^k(x)\}_{\deg g(x)}$ is the coefficient of $X^{\deg g(x)}$ in the polynomial $xr^k(x)$.

10. The method of claim 9 wherein the value of the term $\{x^m\}$ modulo $g(x)$ is fixed and is stored.

11. A method of evaluating the integrity of a packet of m data bits being routed in a stream of bits through a communications medium in a data communications system, the method comprising the steps of:

(a) providing a stream of bits in packets of m data bits through a communication medium in a data communication system;

(b) calculating a remainder polynomial $r^k(x)$ for each bit in the stream of bits, $r^k(x)$ being a sum of partial remainders of a division of (i) a polynomial defining the stream of bits ending in the bit for which $r^k(x)$ is calculated, by (ii) a cyclic redundancy check (CRC) generating polynomial $g(x)$, the partial remainders being derived from at least one of the $r^k(x)$ of the previous bit and a table of partial remainders;

(c) evaluating whether $r^k(x)$ is equal to zero, the end of one of the packets being located and the integrity of the one of the packets being affirmed when $r^k(x)=0$;

(d) retransmitting said one of the packets based on the result of said evaluating step.

12. The method of claim 11 wherein the remainder polynomial is calculated from:

$$r^{k+1}(x) = xr^k(x) + \{xr^k(x)\}_{\deg g(x)} g(x) + b_{m+k} + b_k \{x^m\} \text{modulo } g(x)$$

where b is a bit value, and where $\{xr^k(x)\}_{\deg g(x)}$ is the coefficient of $x^{\deg g(x)}$ in the polynomial $xr^k(x)$.

13. The method of claim 12 wherein the term $\{x^m\}$ modulo $g(x)$ is drawn from a table containing possible values of the term.

14. A method of evaluating the integrity of a packet of m data bits being routed in a stream of bits through a communications medium in a data communications system, the method comprising the steps of:

(a) providing a stream of bits in packets of m data bits through a communication medium in a data communication system;

(b) calculating a remainder polynomial $r^k(x)$ for each byte in the stream of bits, $r^k(x)$ being derived by adding a partial remainder derived from one of the $r^k(x)$ of the previous byte and a table of partial remainders;

(c) evaluating whether $r^k(x)$ is equal to a predetermined value, the end of one of the packets being located and the integrity of the one of the packets being affirmed when $r^k(x)$ is equal to the predetermined value (d) retransmitting said one of the packets based on the result of said evaluating step.

15. The method of claim 14 wherein the predetermined value is zero.

16. A method comprising the steps of:
   (a) providing a data communications system having a communication medium;
   (b) transmitting a stream of bits in packets of M data bits in a plurality of words through the communication medium in the data communication system;
   (c) calculating a remainder polynomial $r^k(x)$ for each word in the stream of bits;
   (d) determining whether the remainder polynomial calculated for each word is equal to a predetermined value; and
   (e) retransmitting one of the packets through the communication medium in the data communication system in response to the determination.

* * * * *